(12) United States Patent
Eilersen (10) Patent No.: US 8,604,809 B2
(45) Date of Patent: Dec. 10, 2013

(54) CURRENT SENSOR CAPACITY MEASURING SYSTEM

(75) Inventor: Nils Aage Juul Eilersen, Vedbæk (DK)

(73) Assignee: Siemens Aktiengesellschaft, Munich (DE)

( * ) Notice: Subject to any disclaimer, the term of this patent is extended or adjusted under 35 U.S.C. 154(b) by 220 days.

(21) Appl. No.: 13/127,209

(22) PCT Filed: Oct. 29, 2009

(86) PCT No.: PCT/DK2009/000228
§ 371 (c)(1),
(2), (4) Date: Jul. 18, 2011

(87) PCT Pub. No.: WO2010/060428
PCT Pub. Date: Jun. 3, 2010

(65) Prior Publication Data
US 2011/0267078 A1  Nov. 3, 2011

(30) Foreign Application Priority Data
Nov. 2, 2008 (DK) ................................. 2008 01505

(51) Int. Cl.
*G01R 27/26* (2006.01)
*G01N 5/02* (2006.01)
*H03B 1/00* (2006.01)
(52) U.S. Cl.
USPC ................ 324/658; 324/667; 73/73; 327/109

(58) Field of Classification Search
USPC .................... 324/658–690; 73/73; 327/109
See application file for complete search history.

(56) References Cited

U.S. PATENT DOCUMENTS

| 4,737,706 A | 4/1988 | Eilersen | |
|---|---|---|---|
| 5,270,588 A * | 12/1993 | Choi | 326/88 |
| 6,798,218 B2 | 9/2004 | Kasperkovitz | |
| 2006/0158200 A1* | 7/2006 | Eilersen | 324/667 |
| 2008/0068030 A1* | 3/2008 | Snyder | 324/658 |

FOREIGN PATENT DOCUMENTS

| EP | 1 158 303 | 11/2001 |
|---|---|---|
| EP | 1 386 173 | 4/2004 |
| GB | 2 006 442 | 5/1979 |
| GB | 2 064 136 | 6/1981 |
| WO | WO 02/075331 | 9/2002 |

* cited by examiner

*Primary Examiner* — Jermele M Hollington
*Assistant Examiner* — Farhana Hoque
(74) *Attorney, Agent, or Firm* — Cozen O'Connor (57) ABSTRACT

A capacitance measuring circuit comprising an oscillator circuit, where a sensor capacitance forms a link of a plurality of series connected impedances and where a square wave voltage is impressed on the series connected impedances from a separate high speed, a low impedance source and the measurement of the charging current, into the series connected impedances, is performed by a separate high accuracy current sensing device, connected in series between the low impedance square wave source and the plurality of the series connected impedances.

6 Claims, 6 Drawing Sheets fig 1

CURRENT SENSOR CAPACITY MEASURING SYSTEM

CROSS-REFERENCE TO RELATED APPLICATIONS

This is a U.S. national stage of International Application No. PCT/DK2009/000228, filed on 29 Oct. 2009. This patent application claims the priority of Denmark Patent Application No. PA 2008 01 505, filed 2 Nov. 2008, the entire content of which application is incorporated herein by reference.

BACKGROUND OF THE INVENTION

1. Field of the Invention

The invention relates to a capacitance measuring circuit where the value of a capacitance to be measured is represented by a frequency output, which is an inverse function of the value of the sensor capacitance.

More specifically the present invention relates to a capacitance measuring circuit, comprising an oscillator circuit. A sensor capacitance forms a link of two or more series connected impedances, which is connected to the capacitance measuring circuit only at end terminals of the series connection. A terminal of the sensor capacitance is an end terminal of the series connection, which is connected to a constant voltage and the other end terminal of the series connection is connected to a sensing node, which oscillates with a square wave voltage to maintain constant voltage levels during each of the half-periods of the oscillation, and which simultaneously senses charging current flowing into the series connected impedances to enable triggering of the capacitance measuring circuit at the moments when the charging current thus sensed has changed to predetermined levels.

2. Description of the Related Art

For many years, capacitances have been measured by a range of well known standard RC oscillator circuits, where the frequency is determined by measuring the charging voltage directly on the sensor capacitance and comparing the measured charging voltage with reference voltages.

This measurement is a high impedance measurement and standard RC oscillator circuits are sensitive to stray capacitances, as these will appear in parallel with the sensor capacitance.

Changes in these capacitances are therefore impossible to discern from each other. The stray capacitances in the standard RC oscillator circuits comes mainly from the wires connecting the sensor capacitance to the oscillator circuit, and from the input capacitance of the oscillator circuit itself. The stray capacitances often are of the same magnitude as the sensor capacitance, and are not constant. Consequently, these stray capacitances present a serious problem in practice.

U.S. Pat. No. 4,737,706 discloses a capacitance measuring circuit in which the sensor capacitance forms a link of two or more series connected impedances. Here, current sensing and square wave generation is performed by an operational amplifier with a feed-back resistor. The output voltage of the operational amplifier, which is a function of the charging current in the series connected impedances, is compared in a voltage comparator with a positive and a negative reference voltage during the positive and the negative cycles of the oscillator, respectively.

As explained, this circuit has the advantage of reducing errors coming from the stray capacitance of the sensing node and the stray capacitance of the connection to the sensor capacitance.

This capacitance measuring circuit functions by measuring the charging current of the sensor capacitance, through the series connected impedances, connected to the low impedance sensing node of the measuring circuit.

The high impedance of the sensor capacitance is thus insulated from the low impedance sensing node by the series connected impedances. As a result, the influence of the stray capacitance at the sensing node and the influence of the stray capacitance of the connecting node between the sensor capacitance and the series connected impedance are separated.

By placing the series connected impedance directly at the sensor capacitor, the stray capacitance at the connecting node between the sensor capacitor and the series connected impedance may be very small, and not of any importance.

The low impedance of the sensing node will rapidly charge the stray capacitance of the sensing node, and long before the trigger level of the charging current is reached and therefore the influence of the stray capacitance of the sensing node is reduced.

In practice the capacitance measuring circuit disclosed in U.S. Pat. No. 4,737,706 has a number of limitations, primarily because the ability of the circuit to reduce the influence of stray capacitances depends on a fast and very low impedance source to generate the square wave voltage, which is impressed on the series connected impedances. In addition, the square wave voltage, as generated in U.S. Pat. No. 4,737,706 by the output of an operational amplifier, has relatively long rise times and a relatively high source impedance.

Therefore stray capacitances are only reduced to a certain degree.

Secondly the precision of the circuit relies mainly on the speed and the precision of the measurement of the charging current and its conversion into a voltage.

The input bias currents and offset voltages of the operational amplifier in the circuit disclosed in U.S. Pat. No. 4,737,706 are temperature dependent and will influence the measurement of the charging current into the series connected impedances. Temperature dependent variations in the open loop amplification factor of the operational amplifier will influence the conversion of the charging current into the output voltage presented to the voltage comparator. Lastly, the speed of the available operational amplifiers is limited because the output value is a voltage.

For these reasons the accuracy of the circuit disclosed in U.S. Pat. No. 4,737,706 is not ideal.

In patent No. EP 1 386 173, an accurate and fast square wave voltage is impressed on that end of the series connected impedances, which is connected to the sensing node of the capacitance measuring circuit, by shifting the complete capacitance measuring circuit alternately between two voltages with constant voltage levels in the half periods of the square wave. The square wave will be defined by these two voltage levels and if fast, low impedance switches and low impedance voltage sources are implemented and if the current comparator is fast and has a low input impedance, then this circuit generates a far more accurate square wave on the sensing node than the circuit of U.S. Pat. No. 4,737,706, and an important condition for reducing the influence of stray capacitances is fulfilled.

The capacitance measuring circuit of EP 1 386 173 has, however, the limitation that a rather high supply voltage is necessary because, in addition to the supply voltage for the current comparator etc., a certain voltage available over and also under this supply voltage is required to keep the supply current alive when the whole circuit is shifted up and down.

In practice, the supply voltage for the circuit is around three times the supply voltage for the comparator and the other components. At times where power consumption is a major issue, this high supply voltage is a definite drawback.

Furthermore, the shifting up and down of the whole circuit generates a substantial noise voltage that interferes with the time measuring circuits connected to the capacitance measuring circuit to provide the capacitance values.

Moreover, both the capacitance measuring circuits of U.S. Pat. No. 4,737,706 and EP 1 386 173 share the drawback that the accuracy of the square wave impressed on the series connected impedances is dependent on the characteristics of an amplifying circuit which, on one hand, has to measure a low voltage or a low current very precisely and, on the other hand, has to be very fast and provide a low input impedance to source a precise square wave.

The precision of the square wave is very important, because charging of the capacitor is determined by the integral of each of the periods of the square wave, which means that long rise and fall times will reduce the integral of the periods and hereby lengthen the periods, compared to the periods of capacitance measuring circuits with a perfect square wave. Because the rise and fall times are temperature dependent, the importance of a precise square wave is obvious.

In practice, the square waves typically have a period of 4 microseconds and rise- and fall times of typically 80 ns with the square wave generated by the operational amplifier of U.S. Pat. No. 4,737,706, and typically 20 ns with the square wave generated by the current amplifier of EP 1 386 173.

These rise- and fall times, each corresponds to 2% and respectively 0.5% of the period of 4 microseconds, and that again means that the square waves generated by the two circuits are 4% respectively 1% from being ideal.

With the ever increasing demand on accuracy an important advantage could be gained by reducing these rise times.

SUMMARY OF THE INVENTION

It is therefore an object of the present invention to provide an improved capacitance measuring circuit without the aforementioned drawbacks.

This and other objects and advantages are achieved in accordance with the invention by providing a highly accurate and high frequency square wave voltage that is impressed on series connected impedances from a separate low impedance source, and the measurement of the charging current, into the series connected impedances is performed by a separate high accuracy current sensing device, connected in series between the low impedance square wave source and the series connected impedances.

In a first preferred embodiment of the invention, the square wave generation is performed by a separate buffer and the measurement of the charging current is performed by a separate current sensor mounted between the buffer and the series connected impedances and a single comparator in connection with a reference current for switching the circuit when a sum of the signal from the current sensor and the reference current crosses the reference level of the comparator.

If the reference level of the comparator is chosen near zero, the amplification factor of the comparator does not influence the switching level.

The series connected impedances consists preferably, but not necessarily of the capacitance to be measured with one end grounded and the other end connected to the current sensor through a resistor.

In this embodiment, the advantage of separating generation of an almost perfect square wave and the precise measurement of the charging current in two separate units is demonstrated.

In another preferred embodiment of the invention, square wave generation is performed by a separate buffer and measurement of the charging current is performed by a separate current sensor mounted between the buffer and the series connected impedances and two separate comparators for switching the circuit when the signal from the current sensor crosses the reference levels of the positive sensing and the negative sensing comparator, respectively.

In a further preferred embodiment of the invention, square wave generation is performed by a separate buffer and the measurement of the charging current is performed by a separate current sensor mounted between the buffer and the series connected impedances and two separate comparators for switching the circuit when the signal from the current sensor crosses the reference levels, set by bias resistors, of the positive sensing and the negative sensing comparator, respectively.

In this embodiment, both comparators are continuously sensing the charging current and a logic unit switches the appropriate comparator output to control the buffer, in addition, one of the comparators operates at the high level of the square wave and the other operates at the low level of the square wave, which places less demands of the common mode rejection of the comparators.

In a further preferred embodiment of the invention, square wave generation is performed by a separate buffer and measurement of the charging current is performed by a separate current sensor mounted between the buffer and the series connected impedances, and a single comparator with a bias circuit switches the buffer through a logic unit.

In yet another preferred embodiment of the invention, square wave generation is performed by a separate buffer and measurement of the charging current is performed by a separate current sensor mounted between the buffer and the series connected impedances, and a single comparator with a bias circuit switches the buffer through a logic unit.

A bootstrap circuit for the power supply of the comparator, places less demands on the common mode range and the common mode rejection of the comparator.

In still another embodiment of the invention, a sensing node is connected to a plurality of series connected impedances, including a plurality of sensor capacitances, through a multiplexing circuit. This embodiment has the advantage that several sensor capacitances are measured by the same circuit, which provides the possibility of, for example, using differential measuring methods.

Other objects and features of the present invention will become apparent from the following detailed description considered in conjunction with the accompanying drawings. It is to be understood, however, that the drawings are designed solely for purposes of illustration and not as a definition of the limits of the invention. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will now be described in further detail with reference to the following drawings, in which.

DETAILED DESCRIPTION OF THE PREFERRED EMBODIMENTS

Figure 1:
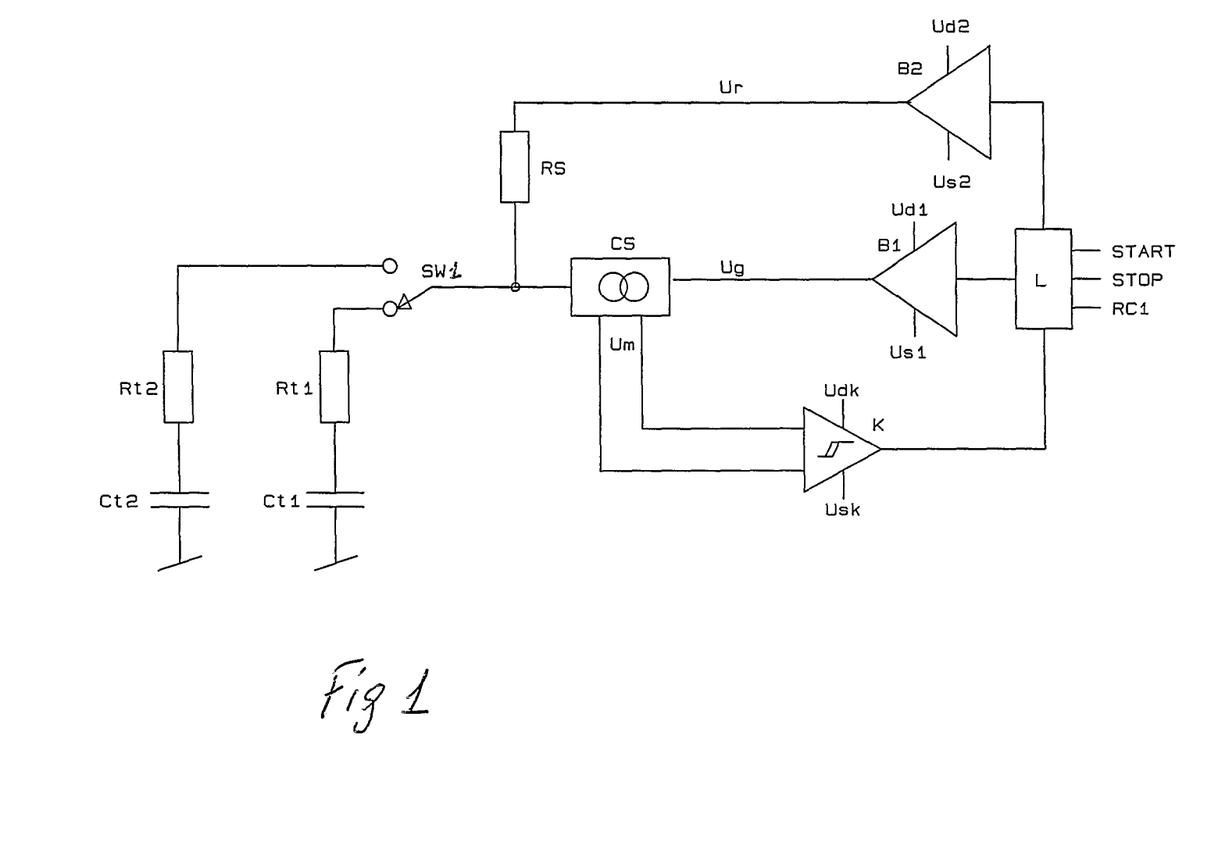
FIG. 1 shows a preferred embodiment of a circuit in accordance with the invention.

The capacitance measuring circuit of FIG. 1, contains a buffer B1, with the output voltage Ug which, through the current sensor CS, is connected to the series connected impedances Rt1/Ct1 or Rt2/Ct2 through the switch SW1.

The output signal Um, from the current sensor CS is measured by the comparator K. Reference currents are created by the buffer B2 and the resistor RS.

The buffer B1 has supply voltages Ud1 and Us1, which typically are +−2.5 VDC. The buffer B2 has supply voltages Ud2 and Us2 which both have to be higher than the supply voltages for B1.

Figure 5:
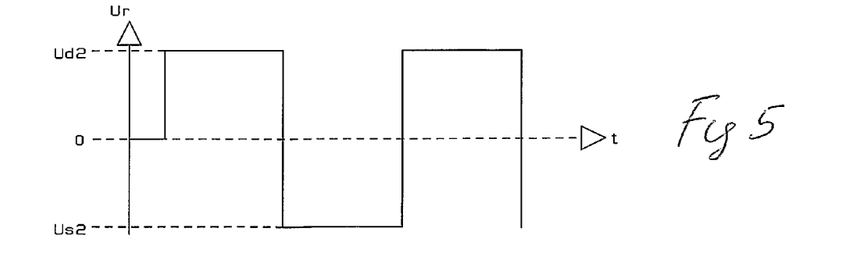
FIG. 5 shows a square wave from the buffer generating the reference current of the circuit of FIG. 1.

The output voltage of buffer B2 is shown in FIG. 5.

The comparator K has supply voltages Udk and Usk which have to be high enough to ensure that the signal from the current sensor CS does not exceed the common mode voltage of the comparator K.

Figure 2:
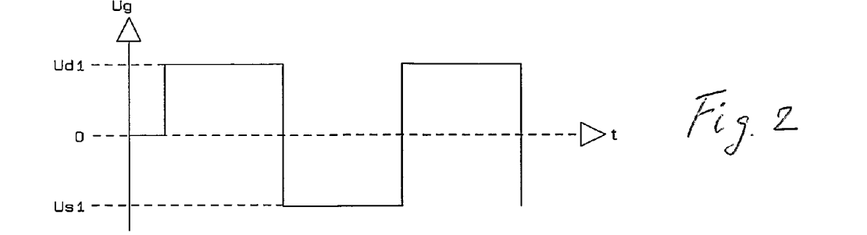
FIG. 2 shows a square wave voltage from the buffer of the circuit of FIG. 1.
Figure 3:
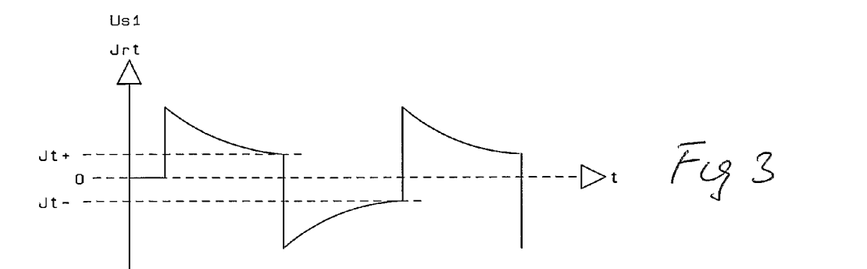
FIG. 3 shows a charging current through the series connected impedance, with fast transitions and an exponentially changing charging current between the transitions of the circuit of FIG. 1.

When the output voltage of the buffer B1, which is shown in FIG. 2, rises to the positive value Ud1, a charging current Jrt, which is shown in FIG. 3, is injected through the series connection of the current sensor CS, the switch SW1 and one of the series connected sets of impedances Rt/Ct, i.e., Rt1/Ct1 or Rt2/Ct2.

At the same time, the buffer B2 injects a positive reference current Jt+ through the resistor RS into the connection node between the current sensor CS and the switch SW1.

With ideal buffers, and with a very low series impedance for the current sensor CS, Jt+ has the value (Ud2−Ud1)/RS.

When the charging current has fallen to the level Jt+, the comparator K, through the logic unit L, switches the buffer B1 to the negative value Us1 (see FIG. 2) and oscillations with a period controlled by the values of Rt/Ct and the different voltages are created.

Figure 4:
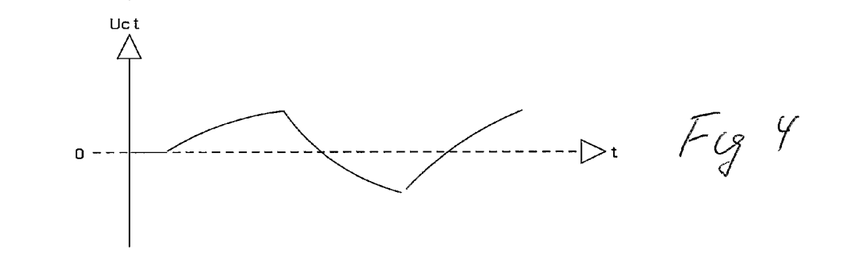
FIG. 4 shows a voltage on a measured capacitor of the circuit of FIG. 1.

In FIG. 4, the voltage on the capacitor Ct, which is not measured, may be compared with the measured charging current Jrt in FIG. 3, for better understanding of the function of the capacitance measuring circuit in accordance with the invention.

The logic unit L controls the interaction between the buffers, comparators and switches and may provide information to time measuring systems with start and stop pulses for a certain number of oscillations with each Rt/Ct combination and information on when Rt1/Ct1 are active.

With separate buffers, which are optimized for only sourcing a near perfect square wave, rise and fall times of less than 5 ns and output impedances of less than 10 ohm may be obtained.

With comparators, which are based on high speed operational amplifiers, with a 1000 V/microsecond slew rate and a very low noise voltage of 0.5 nV, and which only have to measure the charging currents, a very high precision current measurement may be obtained.

The signal voltage of the current sensor CS, and hereby the noise, and the reduction of the influence of stray capacitances may be treated by increasing or decreasing the series impedance of the current sensor CS, relative to the value of Rt.

The current sensor may comprise a simple low value resistor, a current transformer or any other device that can provide a precision signal from the value of the charging current.

A very important characteristic of the capacitance measuring circuit in accordance with the invention is that the value of the series impedance of the current sensor has no influence on the accuracy of the charging current when this value is kept constant.

Figure 6:
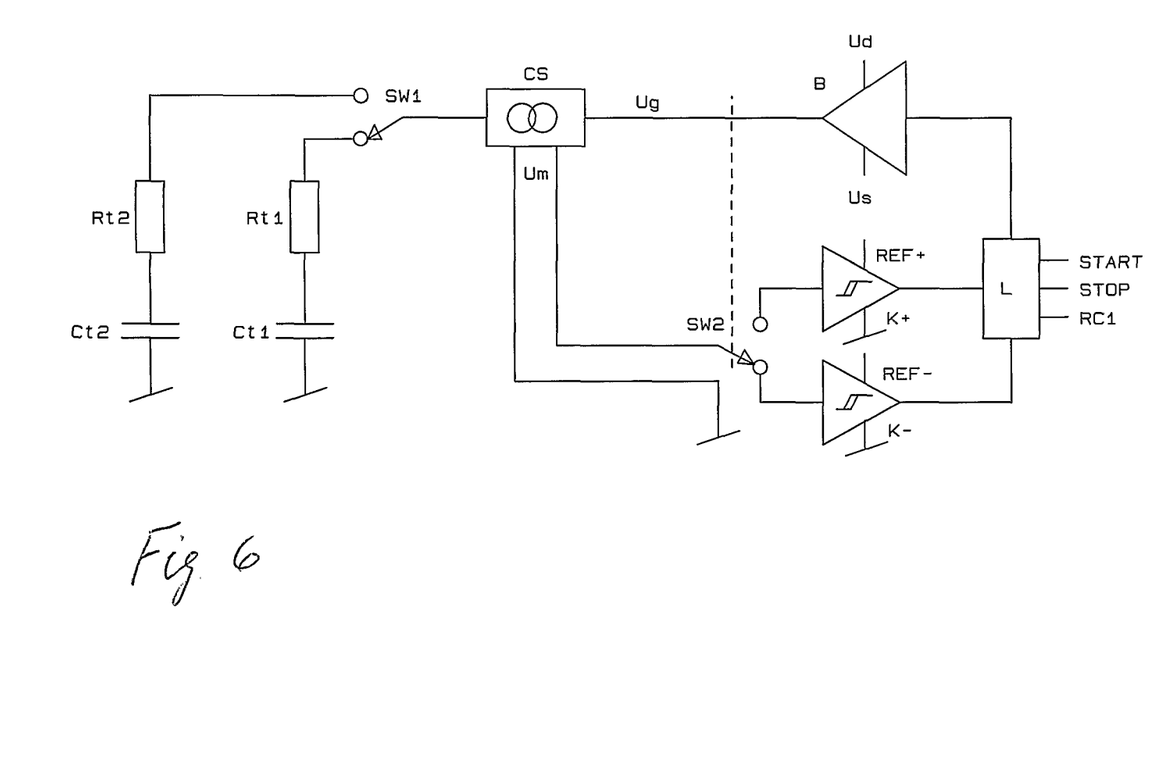
FIG. 6 shows another embodiment of the circuit in accordance with the invention with two separate comparators with programmed switching levels.

The capacitance measuring circuit of FIG. 6, contains a buffer B, with an output voltage Ug, which, through the current sensor CS, is connected to the series connected impedances Rt1/Ct1 or Rt2/Ct2 through the switch SW1.

The positive and negative charging currents are measured separately by the two separate comparators K+ and K−, which are each optimized for operating around the levels for Ud and Us and which have the triggering levels REF+ and REF−, respectively.

Figure 7:
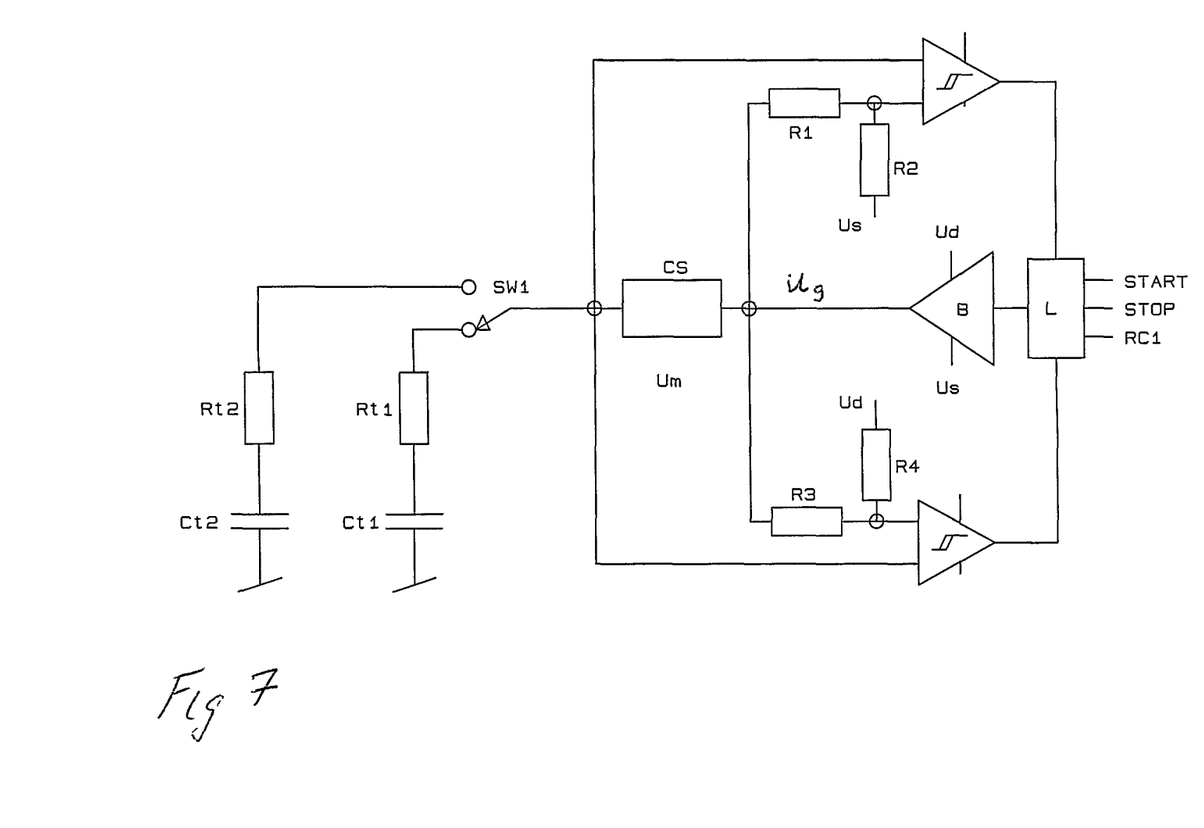
FIG. 7 shows another embodiment of the circuit in accordance with the invention with two separate comparators with switching levels defined by bias circuits.

The capacitance measuring circuit of FIG. 7, contains a buffer B, with an output voltage Ug, which, through the current sensor CS, is connected to the series connected impedances Rt1/Ct1 or Rt2/Ct2 through the switch SW1.

The positive and negative charging currents are measured separately by the two separate comparators K+ and K−, which are each optimized for operating around the levels for Ud and Us respectively.

The comparators are biased by the resistor networks R1/R2 and R3/R4, and are optimized for triggering at around zero voltage difference between the two comparator inputs.

Figure 8:
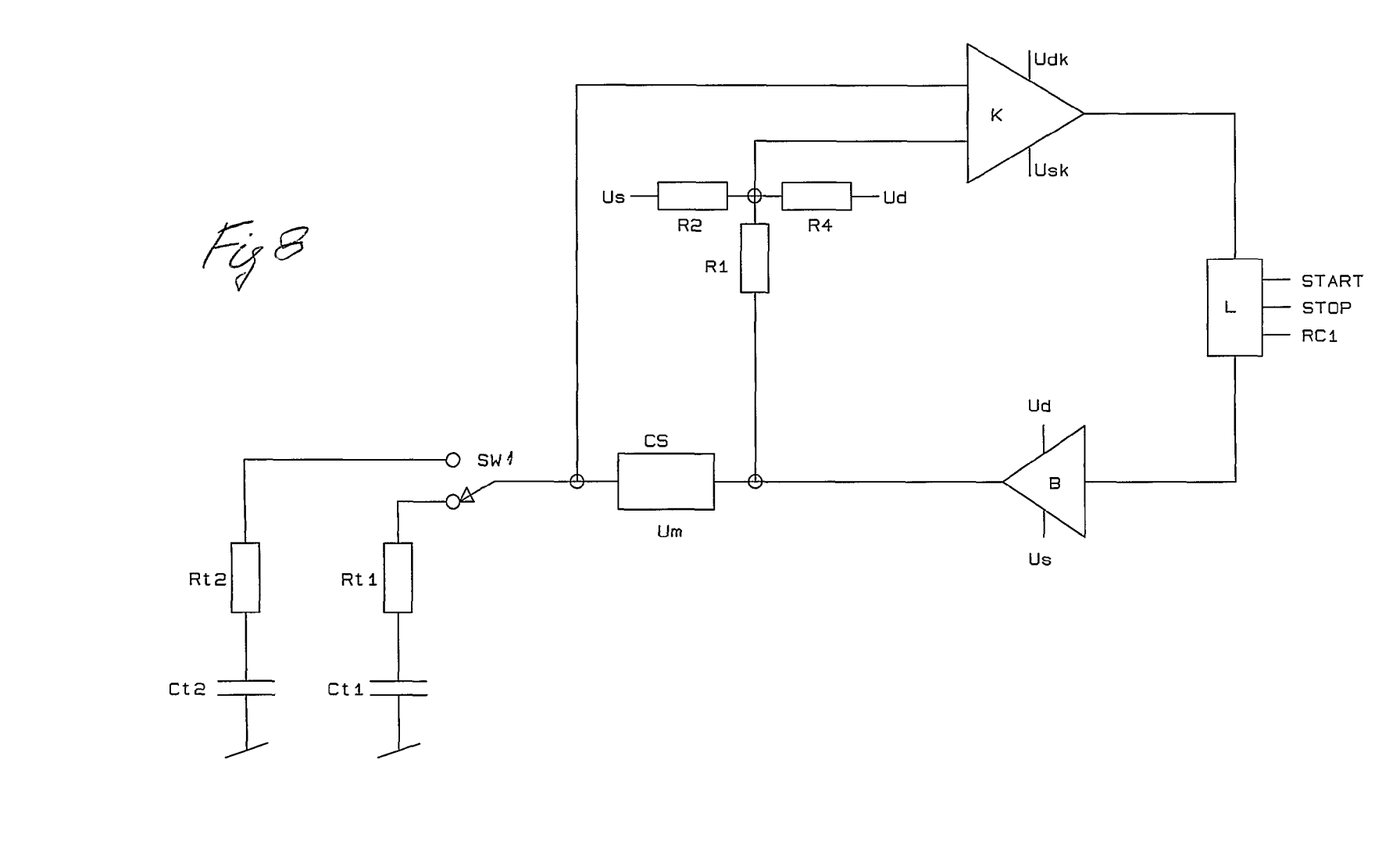
FIG. 8 shows yet another embodiment of the circuit in accordance with the invention with one comparator with switching levels defined by bias circuits.

The capacitance measuring circuit of FIG. 8, contains a buffer B, with an output voltage Ug, which, through the current sensor CS, is connected to the series connected impedances Rt1/Ct1 or Rt2/Ct2 through the switch SW1.

The positive and negative charging currents are measured by the comparator K, which is biased by the resistor network R1 and R2/R4 and which is optimized for triggering at around a zero voltage difference between the two comparator inputs.

Because only one comparator is used with a trigger level around zero voltage an important advantage is obtained in that a shift of a trigger level of the comparator will not result in a change of period, but will only result in a relative change of the two half-periods of the oscillation.

Figure 9:
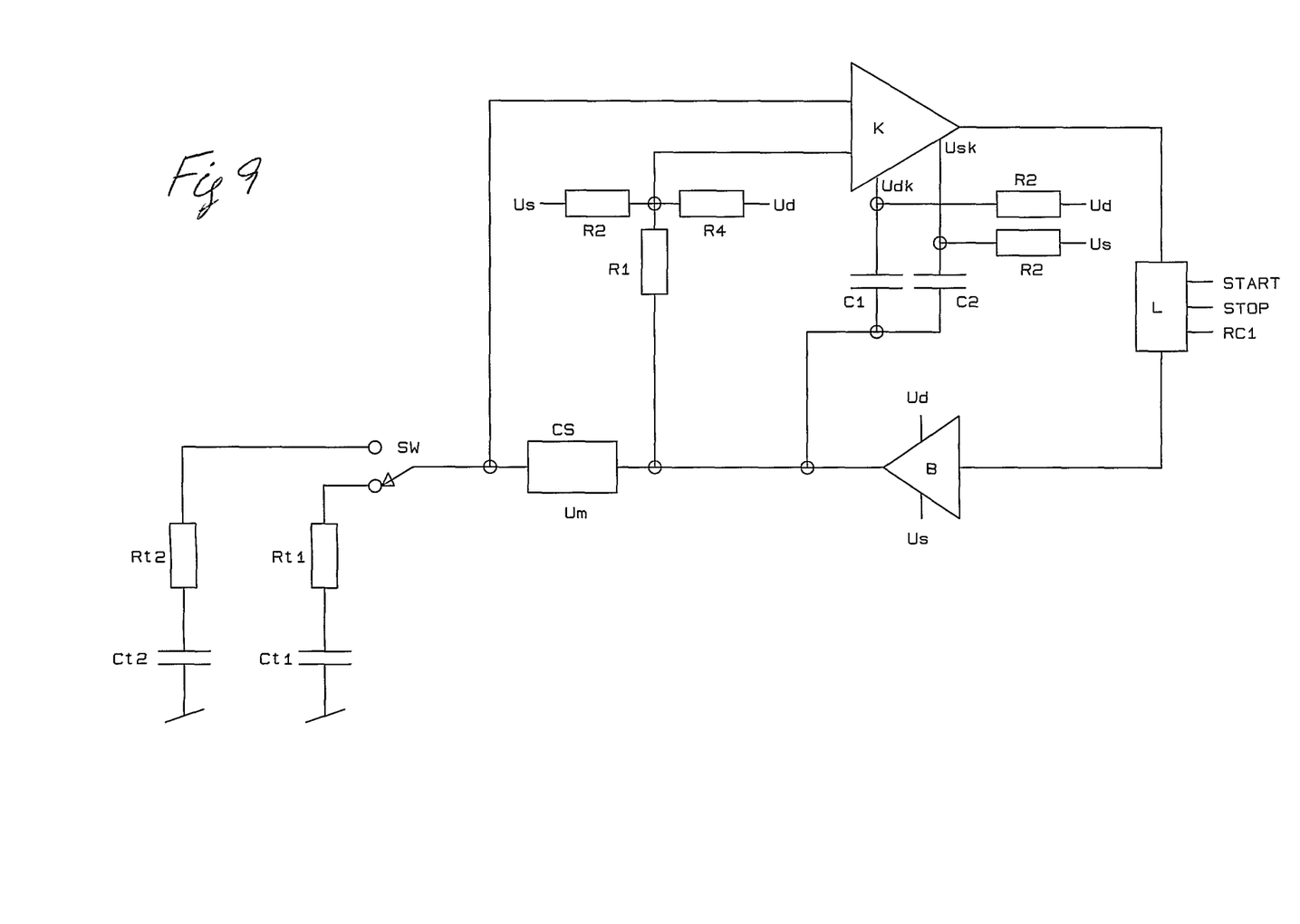
FIG. 9 shows another embodiment of the circuit in accordance with the invention with one comparator having switching levels defined by bias circuits and a bootstrapped power supply for the comparator.

The capacitance measuring circuit of FIG. 9, contains a buffer B, with the output voltage Ug which, through the current sensor CS, is connected to the series connected impedances Rt1/Ct1 or Rt2/Ct2 through the switch SW1.

The positive and negative charging currents are measured by the comparator K, which is biased by the resistor network R1 and R2/R4 and which is optimized for triggering at around a zero voltage difference between the two comparator inputs.

The supply voltages, Udk and Usk, for the comparator K, is generated through the resistors R5/R6 and the capacitors C1/C2 by bootstrapping the voltages Ud and Us from the output of B.

Hereby the specifications for the common mode range and the common mode rejection of the comparator K are far less important.

Because only one comparator is used with a trigger level at around zero voltage, an important advantage is obtained in that a shift of the trigger level of the comparator K will not result in a change of period, but will only result in a relative change of the two half-periods of the oscillation.

Where fast, low noise operational amplifiers are implemented as comparators, a feedback impedance may advantageously be connected from the output to the inverting input of the operational amplifier to provide a stable amplification factor.

Due to the fact that a preferred embodiment of the invention has been illustrated and described herein, it will be apparent to those skilled in the art that modifications and improvements may be made to forms herein specifically disclosed.

Accordingly, the present invention is not to be limited to the forms which are specifically disclosed, the supply voltages, for example, may assume higher or lower values.

Thus, while there are shown, described and pointed out fundamental novel features of the invention as applied to preferred embodiments thereof, it will be understood that various omissions and substitutions and changes in the form and details of the illustrated apparatus, and in its operation, may be made by those skilled in the art without departing from the spirit of the invention. Moreover, it should be recognized that structures shown and/or described in connection with any disclosed form or embodiment of the invention may be incorporated in any other disclosed or described or suggested form or embodiment as a general matter of design choice.

The invention claimed is:

1. A capacitance measuring circuit, comprising:
   an oscillator circuit having:
      a sensor capacitance which forms part of a series connection of at least two series connected impedances, the sensor capacitance being connected to the capacitance measuring circuit only via end terminals of the series connection, one end terminal being connected to a constant voltage and another end terminal of the series connection being connected to a low impedance sensing node, the oscillator circuit oscillating with a square wave voltage at the low impedance sensing node to maintain constant voltage levels during each half-period of the square wave voltage and simultaneously sensing a charging current flowing into the at least two series connected impedances to enable triggering of the capacitance measuring circuit when a sensed charging current has changed to predetermined levels;
   a first buffer for generating the square wave voltage, said first buffer having two different supply voltages, an output voltage of the first buffer being connected through a current sensing resistor to the low impedance sensing node and said current sensing resistor being arranged to sense said charging current; and
   a comparator having a reference level and configured to control the first buffer to switch the output voltage between the different supply voltages when current through the current sensing resistor crosses said reference level.

2. The capacitance measuring circuit according to claim 1, further comprising:
   a second buffer having two different supply voltages and an output voltage, said second buffer being controlled by the comparator to switch said output voltage of the second buffer which is connected through a resistor to the low impedance sensing node to inject a reference current into the series connected impedances parallel to the charging current.

3. The capacitance measuring circuit according to claim 1, further comprising:
   a negative sensing comparator, the comparator being a positive sensing comparator, the positive and negative sensing comparators controlling the first buffer to switch the output voltage between the different supply voltages when the current through the current sensing resistor crosses reference levels of the positive and negative sensing comparators, respectively.

4. The capacitance measuring circuit according to claim 3, wherein each of the comparators is biased by a resistor network.

5. The capacitance measuring circuit according to claim 1, wherein supply voltages of a comparator having a bias resistor network are generated via resistors and capacitors by bootstrapping voltages from the output of the first buffer.

6. The capacitance measuring circuit of claim 1, wherein, the low impedance current sensing node is connected to a plurality of series connected impedances, including a plurality of sensor capacitances, through a switch or multiplexing circuit.

* * * * *